United States Patent [19]
Moon

[11] Patent Number: 5,789,992
[45] Date of Patent: Aug. 4, 1998

[54] METHOD AND APPARATUS FOR GENERATING DIGITAL PULSE WIDTH MODULATED SIGNAL USING MULTIPLIED COMPONENT AND DATA SIGNALS

[75] Inventor: Byung-Joon Moon, Kyunggi-do, Rep. of Korea

[73] Assignee: Samsung Electronics, Co., Ltd., Suwon, Rep. of Korea

[21] Appl. No.: 758,642

[22] Filed: Nov. 27, 1996

[30] Foreign Application Priority Data

Nov. 28, 1995 [KR] Rep. of Korea .............. 95-44315

[51] Int. Cl.⁶ .................................................. H03K 7/08
[52] U.S. Cl. ................................. 332/109; 375/238
[58] Field of Search .................................. 332/109, 110, 332/111; 375/238

[56] References Cited

U.S. PATENT DOCUMENTS 4,164,714  8/1979  Swanson ........................ 332/110
5,363,406  11/1994 Han ................................ 332/109

*Primary Examiner*—Siegfried H. Grimm
*Attorney, Agent, or Firm*—Marger, Johnson, McCollom, & Stolowitz P.C.

[57] ABSTRACT

A method for generating a pulse width modulated signal having a linear relationship to a digital input data signal includes generating a series of PWM component signals, multiplying (ANDing) each of the component signals with one bit of the digital input data, and then summing (ORing) the resulting signals to generate the PWM signal. Each of the component signals corresponds to a single bit of a multi-bit, monotonically increasing counter signal. Each component signal is generated by asserting the component signal only when the corresponding counter bit is asserted and the lower ranking counter bits are not asserted. Two's complement input data can be accommodated by selectively inverting the lower ranking digital input data bits in response to the logic state of the highest ranking input data bit which acts as a sign bit. The multi-bit counter signal is generated by a counter which increments the counter signal by one for each cycle of a clock signal. A component signal generator generates the component signals in response to the counter signal. A selection logic circuit combines the component signals and the digital input data to generate the PWM signal. The selection logic circuit includes a series of multiplexers for selectively inverting the input data in response to one of the input data bits, a multiplier circuit for multiplying each of the component signals with one bit of the digital input data, and a summing circuit for summing the resulting signals to generate the PWM signal.

23 Claims, 7 Drawing Sheets

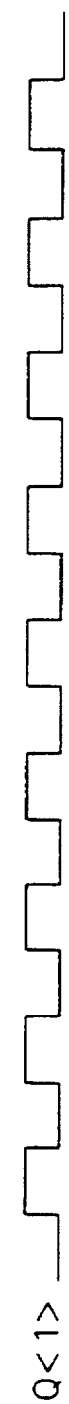
FIG.5A CQ<0>
FIG.5B CQ<1>
FIG.5C CQ<2>
FIG.5D CQ<3>
FIG.5E CQ<4>
FIG.5F CQ<5>
FIG.5G CQ<6>
FIG.5H CQ<7>

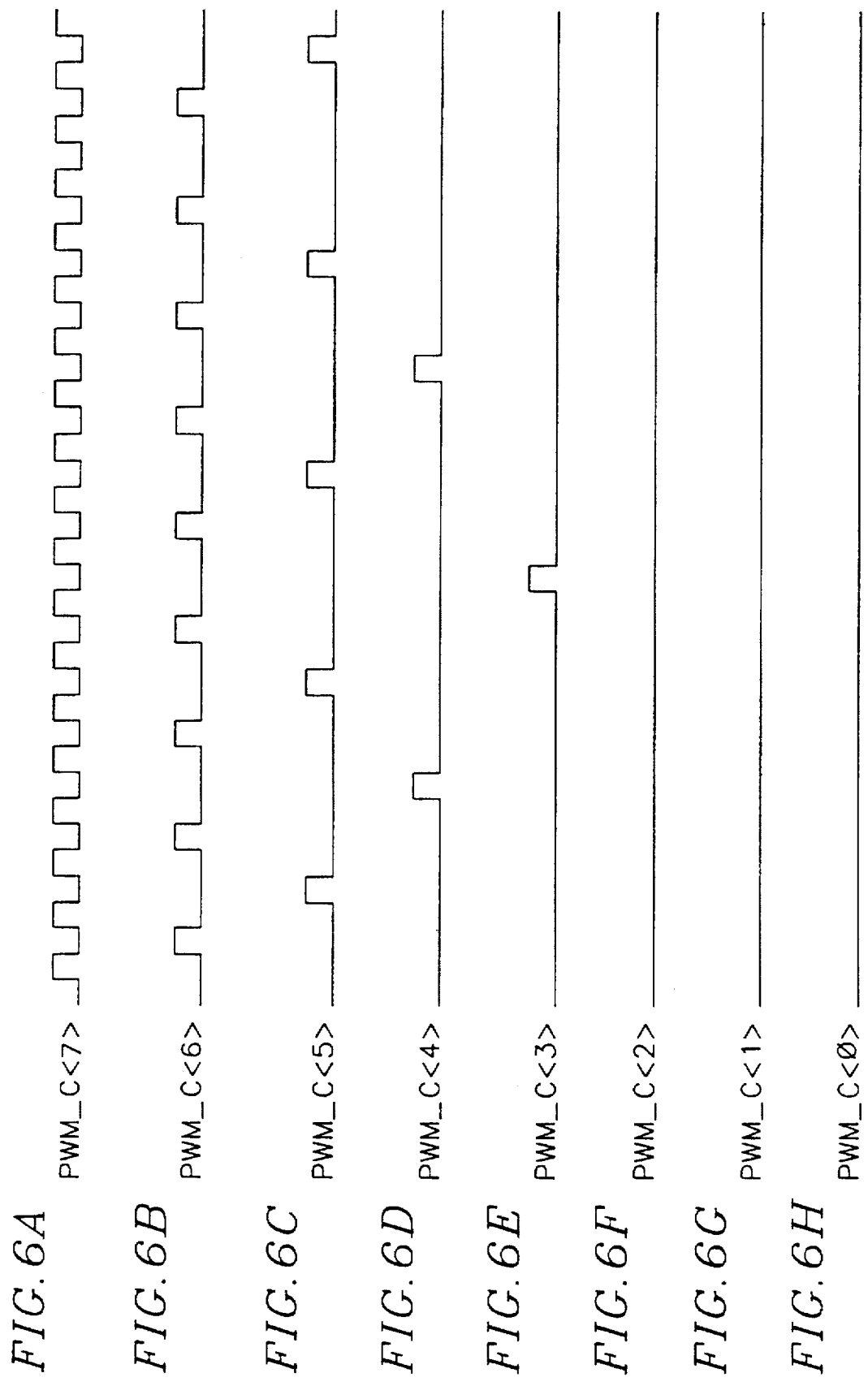

FIG. 7A +127
FIG. 7B +64 
FIG. 7C +32 
FIG. 7D +32 
FIG. 7E +16 
FIG. 7F +0 
FIG. 7G −16 
FIG. 7H −32 
FIG. 7I −64 

FIG. 8

| ID<7:0> | A period of a high logic value/ A period of a low logic value (For 256T) | N |
|---|---|---|
| +64 | 192T/64T | 128 |
| +32 | 160T/96T | 64 |
| +16 | 144T/112T | 32 |
| 0 | 128T/128T | 0 |
| −16 | 112T/144T | −32 |
| −32 | 96T/160T | −64 |
| −64 | 64T/192T | −128 |

(N is the value of subtracting the total period of low logic value from the total period of a high logic vlaue)

METHOD AND APPARATUS FOR GENERATING DIGITAL PULSE WIDTH MODULATED SIGNAL USING MULTIPLIED COMPONENT AND DATA SIGNALS

This application corresponds to Korean Patent Application No. 95-44315 filed Nov. 28, 1995 in the name of Samsung Electronics Company, Ltd., which is herein incorporated by reference.

BACKGROUND OF THE INVENTION

1. Field of the Invention

This invention relates generally to pulse width modulation circuits and more particularly to a circuit which can generate a pulse width modulated signal based on a digital input signal.

2. Description of the Related Art

Referring to FIG. 1, a prior art pulse width modulation circuit includes an adder 1 which combines an analog input signal with a sawtooth wave signal to generate a combination signal I. A voltage comparator 2 generates a pulse width modulated signal II based on the intermediate signal I.

Referring to FIGS. 2A–2D, it can be seen that the prior art pulse width modulator generates a signal which is active when the combination signal exceeds a predetermined voltage limit.

A problem with the prior art pulse width modulation signal is that it requires an analog input signal. Accordingly, a need remains for a technique for generating a pulse width modulating signal in response to a digital input signal.

SUMMARY OF THE INVENTION

Therefore, it is an object of the present invention to provide a method and apparatus for generating a pulse width modulated signal in response to a digital input signal.

Another object of the present invention is to generate a pulse width modulated signal which has a linear relationship to the value of a digital input signal.

To accomplish these and other objectives, the applicant has invented a method and apparatus for generating a pulse width modulated signal having a linear relationship to a digital input data signal. The method includes generating a series of PWM component signals, multiplying each of the component signals with one bit of the digital input data, and then summing the resulting signals to generate the PWM signal. Each of the component signals corresponds to a single bit of a multi-bit, monotonically increasing counter signal. Each component signal is generated by asserting the component signal only when the corresponding counter bit is asserted and the lower ranking counter bits are not asserted. Two's complement input data can be accommodated by selectively inverting the lower ranking digital input data bits in response to the logic state of the highest ranking input data bit which acts as a sign bit.

One aspect of the present invention is a pulse width modulator which includes a component signal generator for generating a plurality of component signals responsive to a counter signal, and a selection logic circuit coupled to the component signal generator. The selection logic circuit generates a pulse width modulation signal responsive to the component signals and a digital input data signal.

Another aspect of the present invention is a method for generating a pulse width modulation signal by first generating a plurality of component signals, and then combining the component signals responsive to a data signal. The data signal includes a plurality of data signal bits, and combining the component signals includes multiplying each of the component signals with a corresponding one of the data signals, thereby generating a plurality of result signals which are summed to generate the pulse width modulated signal.

An advantage of the present invention is that it generates a pulse width modulated signal in response to a digital input signal.

Another advantage of the present invention is that it can accommodate both positive and negative digital input values.

A further advantage of the present invention is that it generates a pulse width modulated signal which has a linear characteristic with respect to the input signal.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 5A–5H are timing diagrams showing waveforms of signals generated by the counter of FIG. 3.

FIGS. 6A–6H are timing diagrams showing waveforms of pulse width modulation component signals generated by the circuit of FIG. 3.

FIGS. 7A–7I are timing diagrams showing a pulse width modulated signal generated by the circuit of FIG. 3 under various operating conditions.

FIG. 8 is a table illustrating a relationship between the pulse width modulated signal and the digital input data in the circuit of FIG. 3.

DETAILED DESCRIPTION

Figure 1:
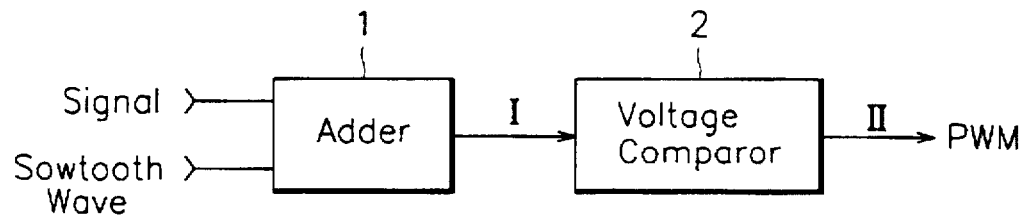
FIG. 1 is a block diagram of a prior art pulse width modulation circuit.
Figure 2A:
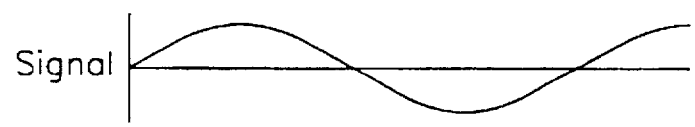
FIG. 2A–2D are drawings showing waveforms of signals in the circuit of FIG. 1.
Figure 2B:
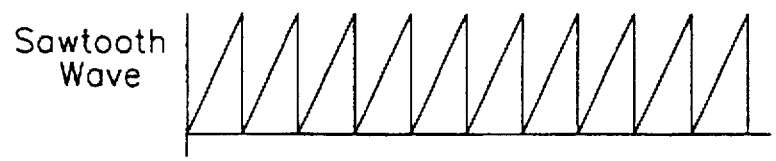
Figure 2C:
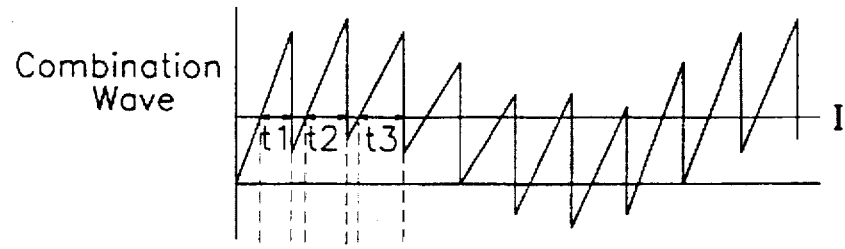
Figure 2D:
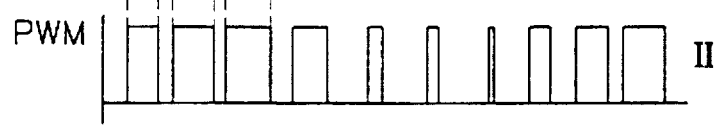
Figure 3:
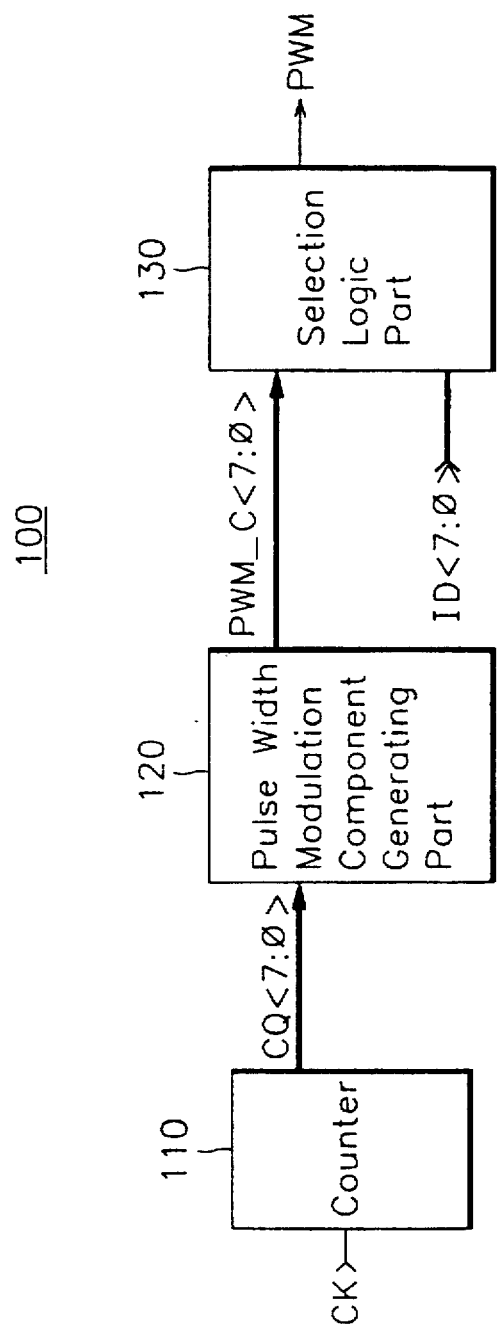
FIG. 3 is a block diagram of an embodiment of a pulse width modulation circuit in accordance with the present invention.

Indicated generally at 100 in FIG. 3 is an embodiment of a pulse width modulation system in accordance with the present invention. Prior to describing the detailed structure of the system 100, the key components will be identified followed by a brief description of the operation of the system. Then a more detailed description of each of the components will be provided along with a more detailed description of the operation. The digital pulse width modulation system 100 includes a counter 110 which generates a counter signal CQ in response to a clock signal CK. In the example embodiment of FIG. 3, the counter signal includes eight individual counter bits CQ<7:0>. However, any number of counter signals can be used depending upon the implementation. The counter 110 increments the eight bit counter signal by one for each cycle of the clock signal CK.

A pulse width modulation component signal generator 120 generates a plurality of component signals in response to the plurality of counter signals. In the example embodiment shown in FIG. 3, the component signal generator generates eight component signals PWM_C<7:0> in response to the seven counter signals CQ<7:0>.

A selection logic circuit 130 is coupled to the pulse width modulation component signal generator 120 to receive the plurality of component signals. The selection logic circuit generates the pulse width modulated output signal PWM by combining the component signals in response to a digital input data signal ID. In the example embodiment of FIG. 3, the input data signal includes eight individually input data signals ID <7:0>. The output characteristic of the PWM signal varies linearly with changes in the value of the digital input data ID. The amount of time that the PWM signal is at a high logic level relative to the low logic level increases as the value of the digital input data increases.

More detailed consideration will now be given to the structure of the pulse width modulation system 100 of the present invention. The component signal generator 120 has K input terminals for receiving K counter signals from counter 110. In the example embodiment, K=8. The counter signals are designated CQ<k> where k has the values 0, 1, 2 . . . K−1. The eight counter signals will be referred to collectively in shorthand as CQ<7:0>. The waveforms of the counter signals CQ<7:0> are shown in FIGS. 5A–5H which are referred to collectively as FIG. 5.

The component signal generator 120 also includes K output terminals for generating K component signals which are designated as PWM_C<k> where k=0, 1, 2 . . . K−1. Each of the component signals corresponds to one of the counter signals such that PWM_Ck> corresponds to CQ<K−1−k>. Thus, PWM_C7> corresponds to CQ<0>, and PWM_C0> corresponds to CQ<7>. Each of the counter signals CQ has a rank corresponding to its k number. Each of the component signals is asserted when its corresponding counter signal CQ<k> is asserted and all of the counter signals having a rank lower than k are not asserted as shown in FIGS. 6A–6H which are referred to collectively as FIG. 6. Thus, the highest ranking component signal PWMC<7> is essentially the lowest ranking counter signal CQ<0> without any change. The lowest ranking component signal PWM_C0> is asserted (logic high level) when the highest ranking counter signal CQ<7> is asserted (logic high level) and all of the lower ranking counter signals CQ<6:0> are not asserted (low logic level).

Figure 4:
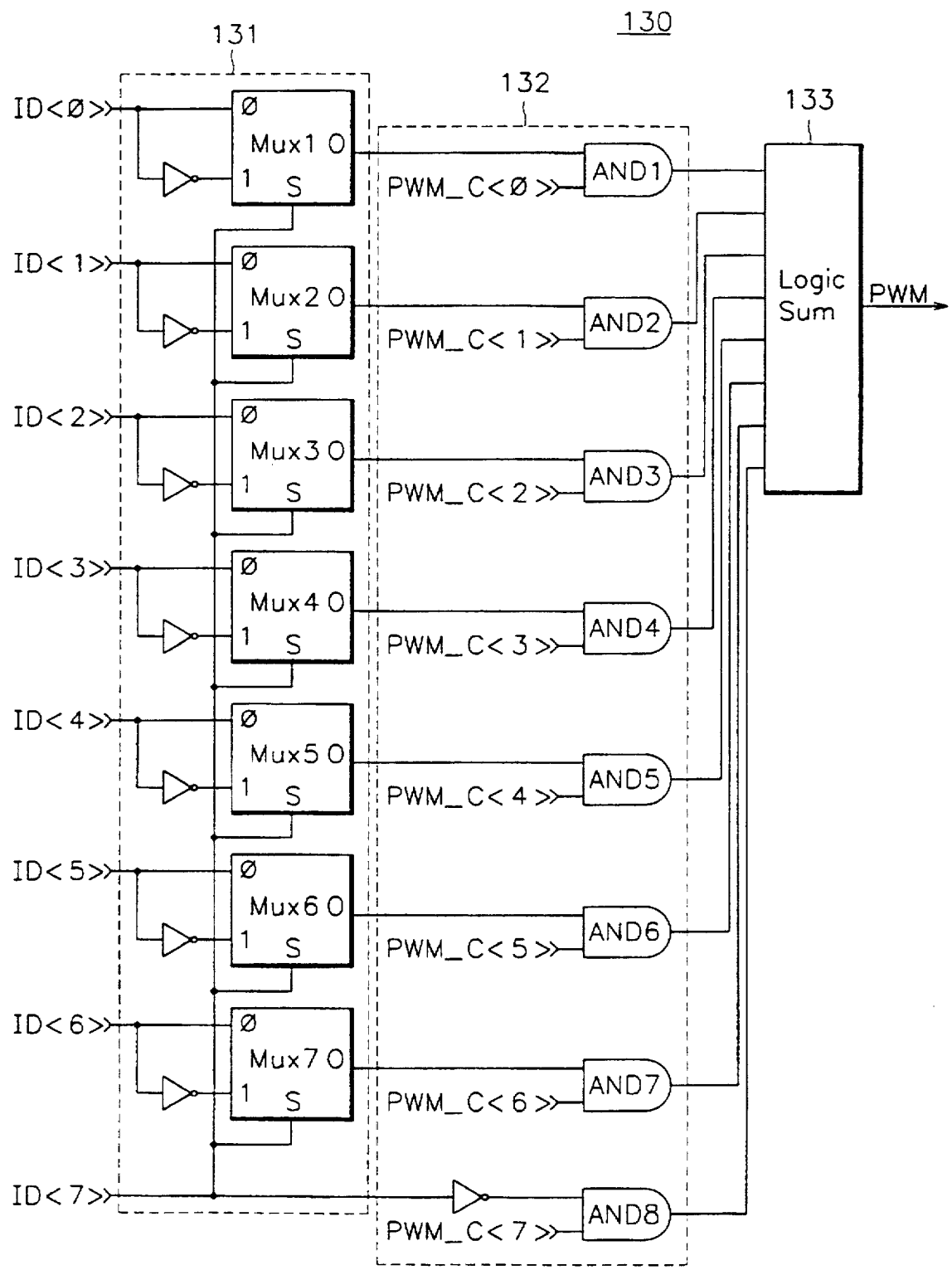
FIG. 4 is a schematic diagram showing more detail of the selection circuit of FIG. 3.

The selection logic circuit 130 is shown in more detail in FIG. 4. The selection logic circuit includes a multiplier circuit 132 which combines the component signals PWM_C7:0> with the input data signals ID <7:0> to generate a plurality of result signals. A logic summing circuit 133 is coupled to the multiplier circuit and generates the pulse width modulated signal PWM by summing the result signals. The selection logic circuit also includes a data selection circuit 131 for selectively inverting the digital input data signals ID<6:0> in response to the highest ranking digital input signal ID<7>. When the input data signal ID<7> is not asserted (low logic level), the selection logic circuit 130 generates the PWM signal by multiplying each input data signal ID<k> with its corresponding component signal PWM_C<k> where k=0−6 to generate seven result signals in summing the result signals. When the highest ranking input data bit ID<7> is asserted (logic high level) the selection logic circuit generates the PWM signal by first inverting each of the input data signals ID<k>, then multiplying the inverted input data signals with the corresponding component signal PWM_Ck> where k=0−6 to generate seven result signals, then summing the result signals.

The data selection circuit 131 includes a plurality of multiplexers MUX1–MUX7. Each multiplexer has a first input terminal for receiving one of the input data signals and a second input terminal for receiving the same input data signal through an invertor. Each multiplexer also has a select terminal S and an output terminal O. The select terminals of all of the multiplexers are connected together and coupled to the highest ranking input data signal ID<7>. The multiplier circuit 132 includes a plurality of AND gates AND 1–AND 8. Each AND gate has a first input terminal connected to the output terminal of one of the multiplexers, a second input terminal coupled to receive one of the component signals, and an output terminal coupled to the logic summing circuit 133. AND 8 has a first input terminal which is coupled to the highest ranking input data signal through an invertor, a second input terminal which is coupled to receive the highest ranking component signal, and an output terminal which is coupled to the logic summing circuit 133. Thus, the input data signals ID<6:0> are passed directly through the multiplexers to the multiplier circuit 132 when the highest ranking input data signal ID<7> is not asserted, while the input data signals ID<6:0> are inverted before passing through the multiplexers to the multiplier 132 when ID<7> is asserted.

More detailed consideration will now be given to the operation of the present invention with reference to FIGS. 3–8. The digital input data signals ID<7:0> can provide digital input data to the selection logic circuit 130 in the form of a two's complement binary number or absolute value codes. In a preferred embodiment, the digital input data is in two's complement format where the highest ranking bit (ID<7>) is a sign bit for determining whether the data is a positive or negative number. The digital input data corresponds to digital decimal numbers in the range −127 to +127.

The operation of the counter 110 is shown with reference to FIG. 5. The counter increments the counter signals CQ<7:0> as a binary number in synchronization with the clock signal CK. The counter increases the binary number by one from 00000000 to 11111111 with each cycle of the clock signal CK.

The operation of the pulse width modulation component signal generator 120 is illustrated in FIG. 6. A first component signal PWM_C0> is at a high logic level only when the counter signals CQ<7:0> have a value 10000000. A second component signal PWM_C1> is at a high logic level when the counter signals CQ<6:0> have the value 1000000 without regard to the state of the counter signal CQ<7>. Likewise, PWM_C2> is high when CQ<5> is high and the lower ranking counter bits a low. The operation of the remaining component signals is similar. It should be noted that PWM_C7> is essentially the lowest ranking counter signal CQ<0> without any changes.

Referring to FIG. 4, the multiplier circuit 132 performs a logical multiplication (AND) of the seven lowest component signals and the output signals from the seven multiplexers. The highest component signal PWM_C7> is multiplied with the complement of the highest ranking digital input data bit ID<7>. The resulting output signals from the multiplier circuit 132 are summed by the logic summing circuit 133. The seven lowest input data bits ID<6:0> are passed through directly to the output terminals of the multiplexer if the highest data bit is low. The seven lowest data bits are inverted by multiplexers MUX1–MUX7 if the highest input data bit is high.

More specifically, if the highest data bit ID<7> is low, the pulse width modulation signal PWM is given by the following expression:

$$PWM = ID\langle 0\rangle \times PWM\_C\langle 0\rangle + ID\langle 1\rangle \times \quad \text{(Eq. 1)}$$
$$PWM\_C\langle 1\rangle + ID\langle 2\rangle \times PWM\_C\langle 2\rangle + ID\langle 3\rangle \times$$
$$PWM\_C\langle 3\rangle + ID\langle 4\rangle \times PWM\_C\langle 4\rangle + ID\langle 5\rangle \times$$
$$PWM\_C\langle 5\rangle + ID\langle 6\rangle \times PWM\_C\langle 6\rangle + PWM\_C\langle 7\rangle$$

When the highest input data bit ID<7> is high, the PWM signal is given by the following expression:

$$PWM = ID\langle 0\rangle' \times PWM\_C\langle 0\rangle + ID\langle 1\rangle' \times \quad \text{(Eq. 2)}$$
$$PWM\_C\langle 1\rangle + ID\langle 2\rangle' \times PWM\_C\langle 2\rangle + ID\langle 3\rangle' \times$$
$$PWM\_C\langle 3\rangle + ID\langle 4\rangle' \times PWM\_C\langle 4\rangle + ID\langle 5\rangle' \times$$
$$PWM\_C\langle 5\rangle \times ID\langle 6\rangle' \times PWM\_C\langle 6\rangle$$

where ID<k>' means the complement of the k-th digital input data bit.

FIGS. 7A–7I, show the waveforms of the pulse width modulated signal PWM for various values of digital input data. T is the time duration of both the high portion and the low portion of a clock cycle of the clock signal CK. In other words, the time of ½ cycle of the clock signal CK is T. Thus, the time required for the clock signals CQ<7:0> to increase from 00000000 to 11111111 is 256T. When the digital input data is a decimal 0 (binary 00000000), the waveform of the PWM signal is similar to the waveform of the lowest ranking bit from the counter CQ<0>, and the PWM signal is asserted (high logic level) for a total time period of 128T during a complete 256T cycle. Likewise, the PWM signal is deasserted for a total time period of 128T during a complete 256T cycle. Accordingly, subtracting the total low time from the total high time results in a value of 0.

Referring to FIG. 7E, when the digital input data is decimal 16, the PWM signal is high for a total time of 144T and low for a total time of 112T during the complete 256T cycle. Accordingly, subtracting the total low time from the total high time produces a result of 32.

As another example, when the digital input data is decimal −16, the PWM signal is high during a total time period of 112T and low for a total time of 144T during a complete 256T cycle. Accordingly, subtracting the total low time from total high time produces a result of −32.

As a further example, referring to FIG. 7D, when the digital input data is decimal 32, the PWM signal is high for a total time of 160T and low a total of 96T during a complete 256T cycle. Thus, subtracting the total low time from the total high time produces a result of 64.

The method described above can be used to calculate the difference between the total low time and total high time of the PWM signal for any value of digital input data from decimal 0 to ±127.

FIG. 8 is a table showing the total high time, total low time, and difference thereof for various values of digital input data for a 256T cycle. As is apparent from the table, the pulse width modulated signal PWM has a linear relationship with the digital input data in the range from decimal 0 to ±127.

Having described and illustrated the principles of the invention in a preferred embodiment thereof, it should be apparent that the invention can be modified in arrangement and detail without departing from such principles. We claim all modifications and variations coming within the spirit and scope of the following claims.

I claim:

1. A pulse width modulator comprising:
  a component signal generator for generating a plurality of component signals responsive to a plurality of counter signals, wherein:
    each component signal corresponds to one of the plurality of counter signals,
    each counter signal has a different cycle time, and
    the component signal generator generates a pulse in each component signal during each cycle of the corresponding counter signal; and
  a selection logic circuit coupled to the component signal generator, the selection logic circuit generating a pulse width modulation signal responsive to the component signals and a data signal.

2. A pulse width modulator according to claim 1 further including a counter coupled to the component signal generator for generating the plurality of counter signals responsive to a clock signal.

3. A pulse width modulator according to claim 1 wherein the selection logic circuit multiplies a first one of the component signals by the data signal.

4. A pulse width modulator comprising:
  a component signal generator for generating a plurality of component signals responsive to a counter signal; and
  a selection logic circuit coupled to the component signal generator, the selection logic circuit generating a pulse width modulation signal responsive to the component signals and a data signal;
  wherein:
    the counter signal includes a plurality of counter signals;
    each counter signal has a rank;
    each component signal corresponds to a counter signal; and
    the component signal generator asserts each component signal when the corresponding counter signal is asserted and all lower ranking counter signals are not asserted.

5. A pulse width modulator according to claim 1 wherein the data signal includes a plurality of data signals.

6. A pulse width modulator comprising:
  a component signal generator for generating a plurality of component signals responsive to a counter signal; and
  a selection logic circuit coupled to the component signal generator, the selection logic circuit generating a pulse width modulation signal responsive to the component signals and a data signal;
  wherein the data signal includes a plurality of data signals; and
  wherein the selection logic circuit includes:
    a multiplier circuit for combining the plurality of component signals with the plurality of data signals, thereby generating a plurality of result signals; and
    a summing circuit coupled to the multiplier circuit for summing the plurality of result signals, thereby generating the pulse width modulation signal.

7. A pulse width modulator according to claim 6 wherein the multiplier circuit includes a plurality of AND gates, each AND gate having a first input terminal for receiving one of the data signals, a second input terminal for receiving a corresponding component signal, and an output terminal coupled to the summing circuit.

8. A pulse width modulator according to claim 6 wherein the selection logic circuit further includes a data selection circuit coupled to the multiplier circuit for selectively inverting one or more of the plurality of data signals.

9. A pulse width modulator according to claim 8 wherein the data selection circuit includes:
  a plurality of multiplexers, each multiplexer having a first input terminal for receiving one of the data signals, a second input terminal, and an output terminal coupled to the multiplier circuit; and a plurality of invertors, each invertor corresponding to one of the multiplexers, each invertor having an input terminal coupled to the first input terminal of the corresponding multiplexer and an output terminal coupled to the second input terminal of the corresponding multiplexer.

10. A pulse width modulator according to claim 9 wherein each multiplexer includes a select terminal coupled together to receive one of the data signals.

11. A pulse width modulator according to claim 10 wherein one of the data signals is coupled to the multiplier circuit through an invertor.

12. A pulse width modulator circuit comprising:

means for generating a plurality of component signals responsive to a plurality of counter signals, wherein:
each component signal corresponds to one of the plurality of counter signals,
each counter signal has a different cycle time, and
said means for generating a plurality of component signals generates a pulse in each component signal during each cycle of the corresponding counter signal; and means for generating a pulse width modulation signal responsive to the plurality of component signals and a plurality of data signals.

13. A pulse width modulation circuit according to claim 12 further including means for generating the plurality of counter signals.

14. A pulse width modulation circuit comprising:

means for generating a plurality of component signals responsive to a plurality of counter signals; and means for generating a pulse width modulation signal responsive to the plurality of component signals and a plurality of data signals;

wherein the means for generating the pulse width modulation signal includes:
means for multiplying each of the plurality of component signals with a corresponding one of the plurality of data signals, thereby generating a plurality of result signals; and
means for summing the result signals.

15. A pulse width modulation circuit according to claim 12 wherein the means for generating the pulse width modulation signal includes means for selectively inverting the plurality of data signals.

16. A method for generating a pulse width modulation signal comprising:

generating a plurality of component signals responsive to a plurality of counter signals, each counter signal having a different cycle time, each component signal corresponding to one of the plurality of counter signals;

generating a pulse in each component signal during each cycle of the corresponding counter signal; and combining the component signals responsive to a data signal.

17. A method for generating a pulse width modulation signal comprising:

generating a plurality of component signals; and combining the component signals responsive to a data signal;

wherein:
generating a plurality of component signals includes:
generating a plurality of counter signals, each counter signal having a rank and corresponding to one of the component signals, and
asserting each component signal when the corresponding counter signal is asserted and all lower ranking counter signals are not asserted.

18. A method for generating a pulse width modulation signal comprising:

generating a plurality of component signals; and combining the component signals responsive to a data signal;

wherein:
the data signal includes a plurality of data signals; and
combining the component signals includes multiplying each of the component signals with a corresponding one of the data signals, thereby generating a plurality of result signals.

19. A method according to claim 18 wherein combining the component signals further includes summing the result signals.

20. A method according to claim 18 wherein combining the component signals further includes selectively inverting one or more of the data signals responsive to another one of the data signals.

21. A pulse width modulator comprising:

a component signal generator for generating a plurality of component signals responsive to a counter signal; and a selection logic circuit coupled to the component signal generator for generating a pulse width modulation signal responsive to the component signals and a data signal, wherein the selection logic circuit multiplies a first one of the plurality of component signals by the data signal.

22. A pulse width modulator according to claim 21 wherein the component signal generator multiplies a second one of the plurality of component signals by a second data signal.

23. A method for generating a pulse width modulation signal comprising:

generating a plurality of component signals;

multiplying each of the plurality of component signals by a corresponding one of a plurality of data signals, thereby generating a plurality of result signals; and summing the result signals.

* * * * *

UNITED STATES PATENT AND TRADEMARK OFFICE
CERTIFICATE OF CORRECTION

PATENT NO.    : 5,789,992
DATED         : August 4, 1998
INVENTOR(S)   : Byung-Joon Moon It is certified that error appears in the above-identified patent and that said Letters Patent is hereby corrected as shown below:

Column 3,
Line 28, "$PWM_c7$" should be -- $PWM\_C7$ --.

Column 4,
Line 48, "bits a low" should be -- bits are low --.

Signed and Sealed this

Twenty-ninth Day of October, 2002

Attest:

Attesting Officer

JAMES E. ROGAN
*Director of the United States Patent and Trademark Office*